US012803266B2

(12) United States Patent
Iseri et al.

(10) Patent No.: US 12,803,266 B2
(45) Date of Patent: Nov. 17, 2026

(54) SEMICONDUCTOR DEVICE

(71) Applicant: Mitsubishi Electric Corporation, Tokyo (JP)

(72) Inventors: Kana Iseri, Tokyo (JP); Yasuo Ata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 163 days.

(21) Appl. No.: 18/838,892

(22) PCT Filed: Apr. 14, 2022

(86) PCT No.: PCT/JP2022/017811

§ 371 (c)(1), (2) Date: Aug. 15, 2024

(87) PCT Pub. No.: WO2023/199472

PCT Pub. Date: Oct. 19, 2023

(65) Prior Publication Data

US 2025/0158383 A1 May 15, 2025

(51) Int. Cl.
*H02H 3/00* (2006.01)
*H02H 3/08* (2006.01)
*H10D 89/60* (2025.01)

(52) U.S. Cl.
CPC ............. *H02H 3/08* (2013.01); *H10D 89/811* (2025.01)

(58) Field of Classification Search
CPC ........................................................ H02H 3/08
See application file for complete search history.

(56) References Cited

U.S. PATENT DOCUMENTS 10,547,300 B1 * 1/2020 Matsubara ........... H03K 17/166
2011/0198587 A1 8/2011 Takeuchi
2012/0126791 A1 5/2012 Nakatake
(Continued)

FOREIGN PATENT DOCUMENTS

JP 2011-171478 A 9/2011
JP 2019-062737 A 4/2019
(Continued)

OTHER PUBLICATIONS

An Office Action; "Notice of Reasons for Refusal," mailed by the Japanese Patent Office on Mar. 11, 2025, which corresponds to Japanese Patent Application No. 2024-515270 and is related to U.S. Appl. No. 18/838,892.
(Continued)

*Primary Examiner* — Stephen W Jackson
(74) *Attorney, Agent, or Firm* — Studebaker Brackett PLLC

(57) ABSTRACT

A plurality of systems of protection circuits are supported without changing a layout in a switching element. A semiconductor device includes a main switching element including a MOSFET and a sense switching element having a smaller area in plan view than the main switching element and for detecting current flowing through the main switching element. A first gate terminal that is a gate terminal of the sense switching element is arranged between a second gate terminal that is a gate terminal of the main switching element and a source terminal of the sense switching element.

9 Claims, 4 Drawing Sheets

(56) References Cited

U.S. PATENT DOCUMENTS

| | | | | |
|---|---|---|---|---|
| 2013/0153900 | A1* | 6/2013 | Kinouchi | G01K 7/01 257/48 |
| 2015/0185275 | A1 | 7/2015 | Sekigawa | |
| 2020/0357791 | A1* | 11/2020 | Noebauer | H10D 30/668 |
| 2023/0139229 | A1* | 5/2023 | Kawahara | H10D 30/669 257/77 |
| 2024/0421689 | A1* | 12/2024 | Telefus | H02M 1/007 |

FOREIGN PATENT DOCUMENTS

| | | | |
|---|---|---|---|
| WO | 2011/048845 | A1 | 4/2011 |
| WO | 2014/097739 | A1 | 6/2014 |

OTHER PUBLICATIONS

International Search Report issued in PCT/JP2022/017811; mailed Jul. 12, 2022.

* cited by examiner

4/4

SEMICONDUCTOR DEVICE

TECHNICAL FIELD

A technique disclosed in the present description relates to a switching element including a main switching element and a sense switching element.

BACKGROUND ART

Conventionally, a short circuit current detection circuit of a current sensing system has been used to realize short-circuit protection. For example, Patent Document 1 discloses a semiconductor device including a main semiconductor element portion through which main current flows, a sense semiconductor element portion through which sense current for detecting the main current flows, a sense resistor, a comparator, and a control circuit.

PRIOR ART DOCUMENT

Patent Document

Patent Document 1: Japanese Patent Application Laid-Open No. 2011-171478

SUMMARY

Problem to be Solved by the Invention

The current sensing system includes a switching element in which a main switching element and a sense switching element are integrated.

As a method of realizing short circuit protection, there is a short circuit current detection circuit (hereinafter, DESAT circuit) of a DESAT system in addition to the short circuit current detection circuit (hereinafter, current sense circuit) of the current sensing system shown in Patent Document 1.

The DESAT circuit is a protection circuit including a high withstand voltage diode outside a main switching element, a resistor, a capacitor, and a control circuit including a constant current source.

In a case where short-circuit operation does not occur, the main switching element is turned on, and drain voltage of the main switching element decreases to on-voltage. Then, current supplied from the constant current source flows into a drain terminal of the main switching element via the resistor and the high withstand voltage diode.

In a case where short-circuit operation occurs, drain voltage of the main switching element becomes higher than on-voltage, and constant current flowing into a drain terminal of the main switching element is supplied to a capacitor in a DESAT circuit. Then, when voltage of the capacitor exceeds a predetermined threshold, short-circuit operation is detected and protection operation is performed.

In a DESAT circuit, it is not necessary to integrate sense switching elements as in a semiconductor device described in Patent Document 1 as an example. Therefore, it is necessary to separately create a layout of switching elements in such a manner that sense switching elements are integrated for a switching element to be protected by a current sense circuit, and sense switching elements are not integrated for a switching element to be protected by a DESAT circuit.

A technique disclosed in the present description has been made in view of the problem as described above, and is a technique for coping with a system of a plurality of protection circuits without changing a layout in a switching element.

Means to Solve the Problem

A semiconductor device according to a first aspect of the technique disclosed in the present description is a semiconductor device including a main switching element including a MOSFET, and a sense switching element including a MOSFET, having a smaller area in plan view than the main switching element, and for detecting current flowing through the main switching element. A first gate terminal that is a gate terminal of the sense switching element is arranged between a second gate terminal that is a gate terminal of the main switching element and a source terminal of the sense switching element.

Effects of the Invention

According to at least the first aspect of the technique disclosed in the present description, it is possible to support a plurality of systems of protection circuits without changing a layout in a switching element. For this reason, convenience is improved.

Further, an object, a feature, an aspect, and an advantage relating to the technique disclosed in the present description will be further clarified by detailed description below and the accompanying drawings.

DESCRIPTION OF EMBODIMENTS

Figure 1:
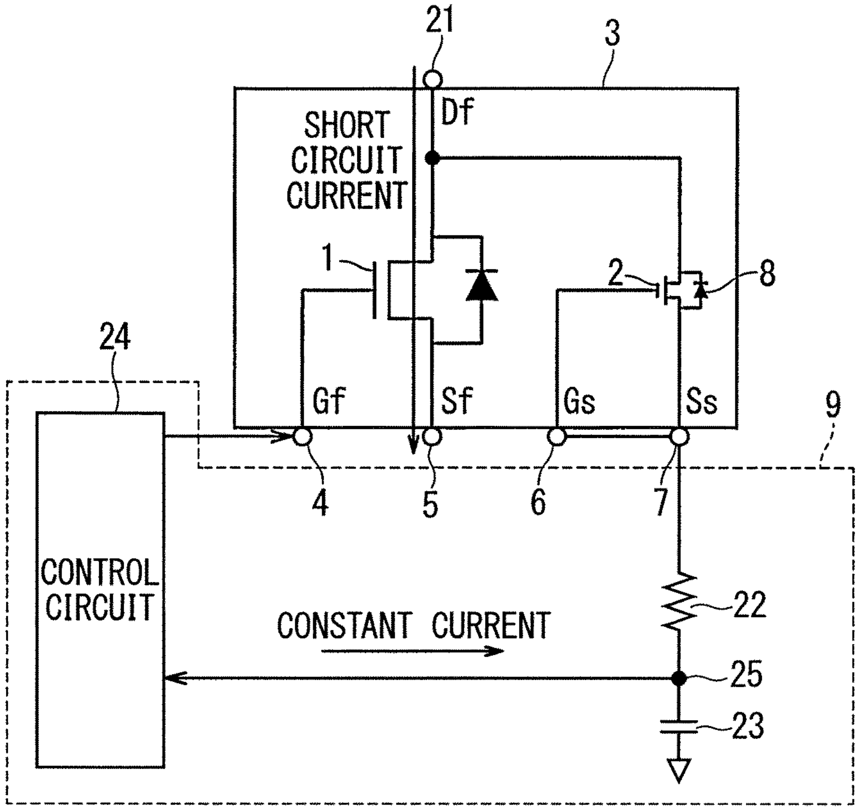
FIG. 1 is a diagram schematically illustrating an example of a configuration of a semiconductor device according to an embodiment.

Hereinafter, an embodiment will be described with reference to the attached drawings. In an embodiment below, a detailed feature and the like are also shown for explanation of a technique, but they are merely examples, and not all of them are necessarily essential features for enabling the embodiment to be carried out.

Note that the drawings are shown schematically, and for convenience of explanation, omission of a configuration, simplification of a configuration, or the like is performed on the drawings as appropriate. Further, an interrelationship between sizes and positions of configurations and the like illustrated in different drawings is not always accurately described and may be changed as appropriate. Further, hatching may be applied to the drawings such as a plan view that is not a cross-sectional view in order to facilitate understanding of content of an embodiment.

Further, in description shown below, similar constituent elements are illustrated with the same reference numerals. This similarly applies to their names and functions. Therefore, there is a case where detailed description of them is omitted to avoid duplication.

Further, in description described in the present description, in a case where description of "comprising", "including", or "having" a certain constituent element or the like is shown, such an expression is not an exclusive expression for excluding the presence of other constituent elements unless otherwise specified.

Further, in description described in the present description, in a case where ordinal numbers such as "first" or "second" are used, these terms are used for convenience to facilitate understanding of content of an embodiment, and content of the embodiment is not limited to order or the like that can be caused by these ordinal numbers.

First Embodiment

Hereinafter, a semiconductor device according to the present embodiment will be described.

Configuration of Semiconductor Device

FIG. 1 is a diagram schematically illustrating an example of a configuration of the semiconductor device according to the present embodiment.

As illustrated in FIG. 1, the semiconductor device includes a switching element 3 and a DESAT circuit 9 that is a protection circuit.

In the switching element 3, a main switching element 1 constituted by a metal-oxide-semiconductor field-effect transistor (that is, MOSFET) or the like, and a sense switching element 2 constituted by a MOSFET that has a smaller area in plan view than the main switching element 1 and senses current flowing through the main switching element 1 are integrated into one element.

In the switching element 3, a gate terminal 4 of the main switching element 1 and a gate terminal 6 of the sense switching element 2 are not connected and are integrated independently of each other. Further, a drain terminal 21 of the main switching element 1 and a drain terminal 21 of the sense switching element 2 are common. Further, a diode 8 is built in the sense switching element 2.

The DESAT circuit 9 includes a resistor 22 connected to a source terminal 7 of the sense switching element 2, a capacitor 23 connected to the resistor 22, and a control circuit 24 including a constant current source. The control circuit 24 controls voltage applied to the gate terminal 4 of the main switching element 1 while applying constant current to a connection point 25 where the resistor 22 and the capacitor 23 are connected.

In the DESAT circuit 9, in a case where short circuit current flows between the drain terminal 21 and a source terminal 5 of the main switching element 1, drain voltage of the main switching element 1 becomes voltage higher than on-voltage, and constant current flowing into the drain terminal 21 of the main switching element 1 is supplied to the capacitor 23 in the DESAT circuit 9. Then, when voltage of the capacitor 23 exceeds a predetermined threshold, the control circuit 24 detects short-circuit operation and performs protection operation (control of voltage applied to the gate terminal 4 of the main switching element 1).

Here, the DESAT circuit 9 does not include a high withstand voltage diode. Further, the DESAT circuit 9 short-circuits the gate terminal 6 of the sense switching element 2 and the source terminal 7 of the sense switching element 2.

By short-circuiting the gate terminal 6 of the sense switching element 2 and the source terminal 7 of the sense switching element 2, the diode 8 built in the sense switching element 2 can be utilized as a high withstand voltage diode. For this reason, it is possible to incorporate a high withstand voltage diode normally required in a DESAT circuit, leading to cost reduction or space saving.

Figure 2:
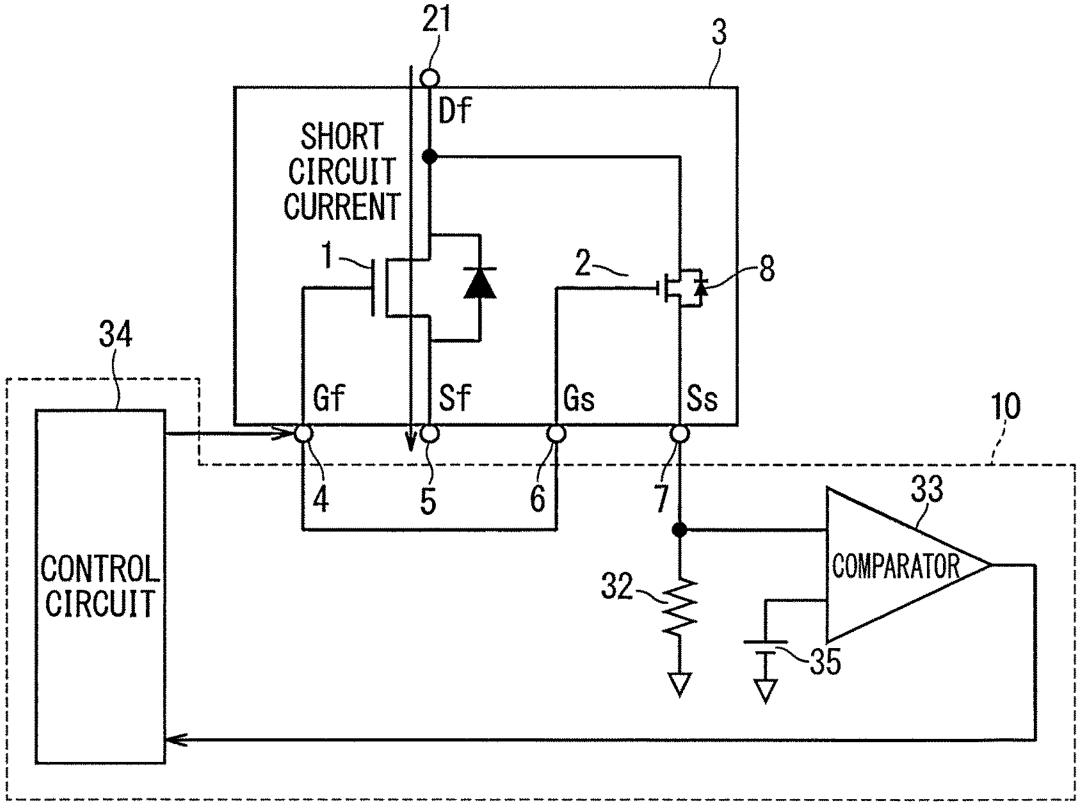
FIG. 2 is a diagram schematically illustrating another example of the configuration of the semiconductor device according to the embodiment.

FIG. 2 is a diagram schematically illustrating another example of a configuration of the semiconductor device according to the present embodiment.

As exemplified in FIG. 2, the semiconductor device includes the switching element 3 and a current sense circuit 10 that is a protection circuit.

The current sense circuit 10 includes a sense resistor 32 connected to the source terminal 7 of the sense switching element 2, a comparator 33 that compares voltage input to the sense resistor 32 with trip voltage (reference voltage), a voltage source 35 that inputs trip voltage to the comparator 33, and a control circuit 34 connected to the comparator 33. The control circuit 34 controls voltage applied to the gate terminal 4 of the main switching element 1 based on output from the comparator 33.

In a case where short circuit current flows between the drain terminal 21 and the source terminal 5 of the main switching element 1, the current sense circuit 10 detects, based on output of the comparator 33, that voltage applied to the source terminal 7 of the sense switching element 2 exceeds trip voltage (reference voltage for determining current cutoff) given from the voltage source 35. Then, the control circuit 34 performs protection operation (voltage control to the gate terminal 4 of the main switching element 1).

Here, the current sense circuit 10 short-circuits the gate terminal 6 of the sense switching element 2 and the gate terminal 4 of the main switching element 1.

By short-circuiting the gate terminal 4 of the main switching element 1 and the gate terminal 6 of the sense switching element 2, the diode 8 built in the sense switching element 2 can be utilized as a high withstand voltage diode. For this reason, it is possible to incorporate a high withstand voltage diode, leading to cost reduction or space saving.

Note that the gate terminal 6 of the sense switching element 2 is arranged between the gate terminal 4 of the main switching element 1 and the source terminal 7 of the sense switching element 2. By arranging the gate terminal 6 of the sense switching element 2 between the gate terminal 4 of the main switching element 1 and the source terminal 7 of the sense switching element 2 and integrating them as the switching element 3, short circuit between the gate terminal 6 and the source terminal 7 or short circuit between the gate terminal 6 and the gate terminal 4 can be easily realized in a shortest distance.

Figure 3:
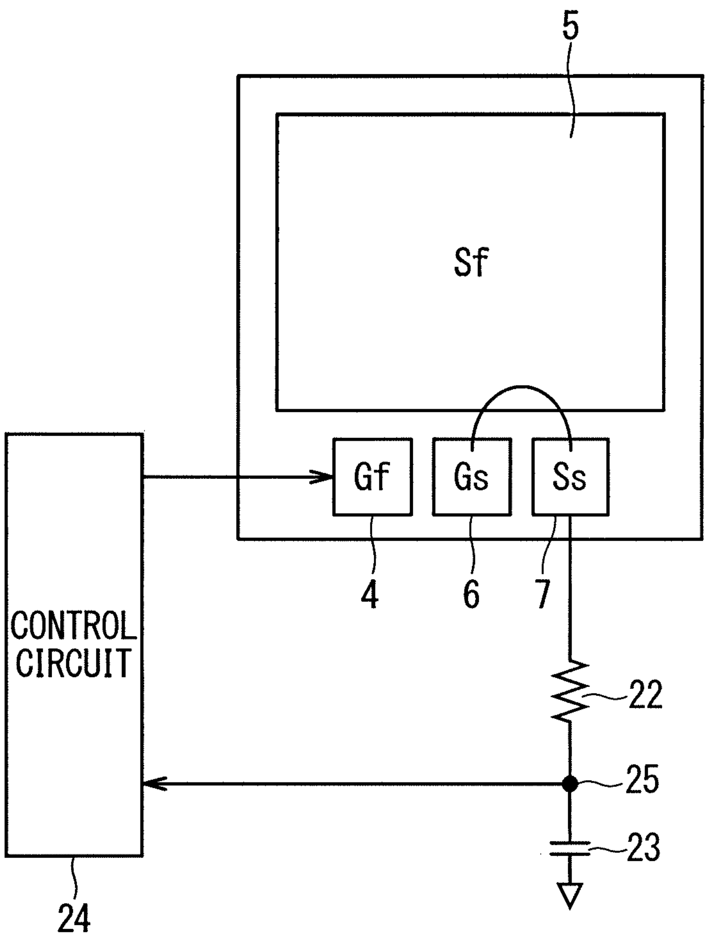
FIG. 3 is a diagram schematically illustrating, in particular, an example of arrangement of a gate terminal of a sense switching element, a gate terminal of a main switching element, and a source terminal of the sense switching element in the configuration of the semiconductor device according to the present embodiment.
Figure 4:
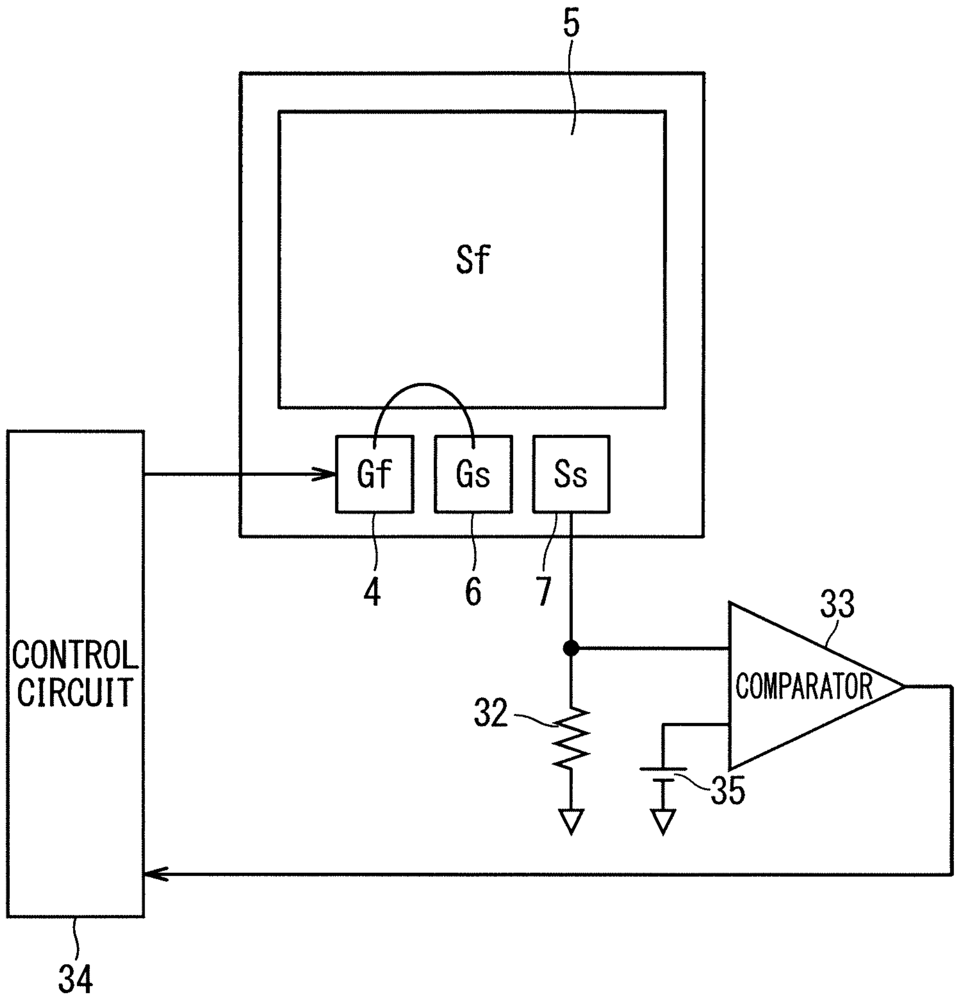
FIG. 4 is a diagram schematically illustrating, in particular, an example of arrangement of a gate terminal of the sense switching element, a gate terminal of the main switching element, and a source terminal of the sense switching element in the configuration of the semiconductor device according to the present embodiment.

FIGS. 3 and 4 are diagrams schematically illustrating, in particular, an example of arrangement of the gate terminal 6 of the sense switching element 2, the gate terminal 4 of the main switching element 1, and the source terminal 7 of the sense switching element 2 in a configuration of the semiconductor device according to the present embodiment.

As exemplified in FIG. 3, when the gate terminal 6 of the sense switching element 2 is arranged between the gate terminal 4 of the main switching element 1 and the source terminal 7 of the sense switching element 2, the gate terminal 6 of the sense switching element 2 and the source terminal 7 of the sense switching element 2 can be connected in a shortest distance to be short-circuited in a case where the DESAT circuit 9 is connected.

Further, as exemplified in FIG. 4, when the gate terminal 6 of the sense switching element 2 is arranged between the gate terminal 4 of the main switching element 1 and the source terminal 7 of the sense switching element 2, the gate terminal 6 of the sense switching element 2 and the gate terminal 4 of the main switching element 1 can be connected in a shortest distance to be short-circuited in a case where the current sense circuit 10 is connected.

According to the above configuration, the DESAT circuit 9 or the current sense circuit 10 can be selectively connected without changing a layout of the switching element 3. That is, a layout of the switching element 3 can be shared between a case of connecting the DESAT circuit 9 and a case of connecting the current sense circuit 10.

Second Embodiment

The semiconductor device according to the present embodiment will be described. Note that, in description below, a constituent element similar to a constituent element described in the embodiment described above is denoted by the same reference sign, and will be omitted from detailed description as appropriate.

Configuration of Semiconductor Device

Figure 5:
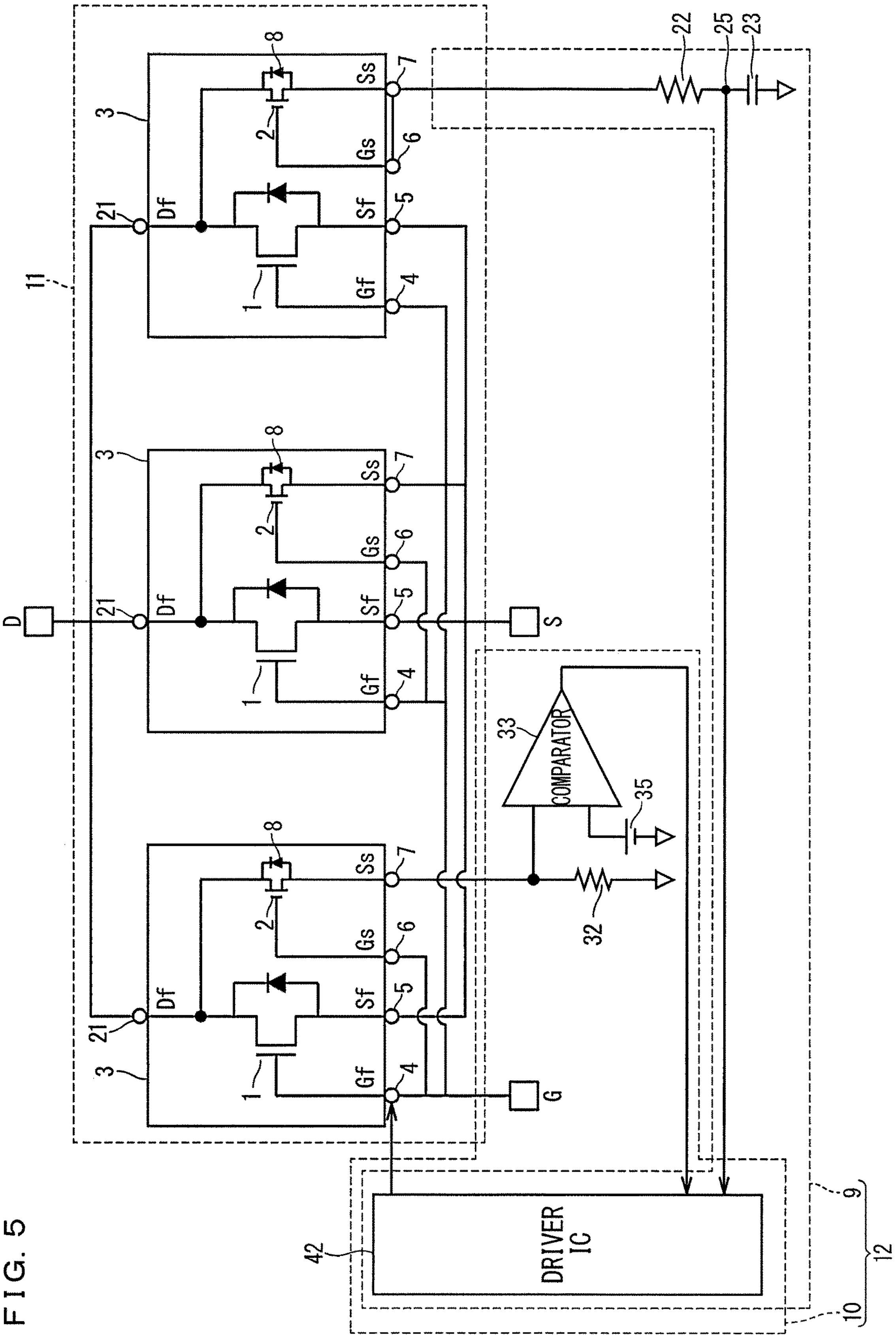
FIG. 5 is a diagram schematically illustrating an example of the configuration of the semiconductor device according to the embodiment.

FIG. 5 is a diagram schematically illustrating an example of a configuration of the semiconductor device according to the present embodiment.

As exemplified in FIG. 5, the semiconductor device includes a plurality of the switching elements 3 connected in parallel to each other and a protection circuit 12.

In the switching element 3, the main switching element 1 and the sense switching element 2 are integrated in one element. A plurality of the switching elements 3 are connected in parallel to form a power module 11. In each of the switching elements 3, the gate terminal 6 of the sense switching element 2 is arranged between the gate terminal 4 of the main switching element 1 and the source terminal 7 of the sense switching element 2.

The protection circuit 12 includes the resistor 22 connected to the source terminal 7 of the sense switching element 2 in any one of the switching elements 3, the capacitor 23 connected to the resistor 22, the sense resistor 32 connected to the source terminal 7 of the sense switching element 2 in any one of the switching elements 3, the comparator 33 that compares voltage input to the sense resistor 32 with trip voltage (reference voltage), the voltage source 35 that inputs trip voltage to the comparator 33, and a driver IC 42 including a constant current source.

The resistor 22, the capacitor 23, and the driver IC 42 can constitute a DESAT circuit. Further, the sense resistor 32, the comparator 33, the voltage source 35, and the driver IC 42 can constitute a current sense circuit.

Here, it is assumed that the sense switching element 2 to which the resistor 22 is connected and the sense switching element 2 to which the sense resistor 32 is connected are the sense switching elements 2 in different ones of the switching elements 3. Further, in the switching element 3 to which the resistor 22 is connected, the gate terminal 6 and the source terminal 7 are short-circuited, and in the switching element 3 to which the sense resistor 32 is connected, the gate terminal 4 and the gate terminal 6 are short-circuited.

The driver IC 42 controls voltage applied to the gate terminal 4 of the main switching element 1 in any of the switching elements 3 while applying constant current to the connection point 25 where the resistor 22 and the capacitor 23 are connected. Specifically, when voltage of the capacitor 23 exceeds a predetermined threshold, the driver IC 42 controls voltage applied to the gate terminal 4 of the main switching element 1. In FIG. 5, the driver IC 42 controls voltage applied to the gate terminal 4 in the switching element 3 to which the sense resistor 32 is connected, but since the gate terminals 4 are connected to each other between a plurality of the switching elements 3 connected in parallel, it is similar to controlling voltage applied to the gate terminal 4 in another one of the switching elements 3 connected in parallel.

Further, the driver IC 42 controls voltage applied to the gate terminal 4 of the main switching element 1 in any of the switching elements 3 based on output from the comparator 33.

Note that, in the above case, the driver IC 42 is shared between a case of constituting a DESAT circuit and a case of constituting a current sense circuit. However, the driver ICs 42 constituting a DESAT circuit and a current sense circuit may be separately provided.

By connecting the resistor 22, the capacitor 23, and the driver IC 42 constituting a DESAT circuit to one of the switching elements 3 among a plurality of the switching elements 3 connected to each other in parallel, and by connecting the sense resistor 32, the comparator 33, the voltage source 35, and the driver IC 42 constituting a current sense circuit to another one of the switching elements 3, in a case where short circuit current flows between the drain terminal 21 and the source terminal 5 of the main switching element 1 in a plurality of the switching elements 3 among a plurality of the switching elements 3 connected in parallel, short circuit current is detected by a DESAT circuit or a current sense circuit connected to the source terminal 7 of each of the main switching elements 1, so that a corresponding one of the main switching elements 1 can be appropriately protected. That is, by increasing the number of cases where a DESAT circuit or a current sense circuit is connected to the switching element 3, each of a plurality of the switching elements 3 connected in parallel can be effectively protected.

Third Embodiment

The semiconductor device according to the present embodiment will be described. Note that, in description below, a constituent element similar to a constituent element described in the embodiment described above is denoted by the same reference sign, and will be omitted from detailed description as appropriate.

Configuration of Semiconductor Device

In the present embodiment, at least one of the sense switching elements 2 integrated in the switching element 3 is a SiC-MOSFET.

In the configuration illustrated in FIG. 5, in a DESAT circuit, in a case where threshold voltage for determining detection of short circuit current is Vdesat, current supplied from a constant current source in the driver IC 42 is Ichg, external resistance is Rdesat, capacitance of an external capacitor is Cdesat, forward voltage of a high withstand voltage diode is Vf, and delay time (response speed) from occurrence of short circuit is Tdesat, Tdesat can be expressed as described below.

$$Tdesat = \{Cdesat \times [(Vdesat - (Vf + Ichg \times Rdesat)]\} / Ichg$$

According to the above equation, as Vf increases, Tdesat decreases.

In the switching element 3 including the sense switching element 2 of a SiC-MOSFET, the forward voltage Vf of a built-in diode at low current is high as compared with Si (0.6 V). For this reason, when the sense switching element 2 is a SiC-MOSFET, a response speed can be increased.

Regarding Effect Generated by Embodiment Described Above

Next, an example of an effect generated by the embodiment described above will be described. Note that, in description below, the effect will be described based on a specific configuration exemplified in the embodiment described above, but the configuration may be replaced with another specific configuration exemplified in the present description as long as a similar effect is generated. That is, hereinafter, for convenience, only one of associated specific configurations may be described as a representative, but the specific configuration described as a representative may be replaced with another associated specific configuration.

Further, the replacement may be performed across a plurality of embodiments. That is, there may be a case where a similar effect is generated by combination of configurations exemplified in different embodiments.

According to the embodiment described above, the semiconductor device includes the main switching element 1 including a MOSFET and the sense switching element 2. The sense switching element 2 includes a MOSFET. Further, the sense switching element 2 has a smaller area in plan view than the main switching element 1. Further, the sense switching element 2 detects current flowing through the main switching element 1. Then, a first gate terminal which is a gate terminal of the sense switching element 2 is arranged between a second gate terminal which is a gate terminal of the main switching element 1 and the source terminal 7 of the sense switching element 2. Here, the first gate terminal corresponds to, for example, the gate terminal 6. The second gate terminal corresponds to, for example, the gate terminal 4.

According to such a configuration, it is possible to support a system of a plurality of protection circuits without changing a layout in the switching element 3. For this reason, convenience is improved. Further, by arranging the gate terminal 6 between the gate terminal 4 and the source terminal 7, in a case where the gate terminal 6 and the gate terminal 4 are short-circuited and in a case where the gate terminal 6 and the source terminal 7 are short-circuited, it is possible to easily connect the gate terminal 6 and the gate terminal 4 or the source terminal 7 in a shortest distance.

Note that, also in a case where another configuration exemplified in the present description is appropriately added to the above configuration, that is, also in a case where another configuration in the present description not mentioned as the above configuration is appropriately added, a similar effect can be generated.

Further, according to the embodiment described above, the semiconductor device includes the resistor 22 connected to the source terminal 7 of the sense switching element 2, the capacitor 23 connected to the resistor 22, and the control circuit 24. Here, the gate terminal 6 and the source terminal 7 are short-circuited. Then, in a case where voltage of the capacitor 23 exceeds a predetermined threshold, the control circuit 24 controls voltage applied to the gate terminal 4. According to such a configuration, if a protection circuit is a DESAT circuit, a layout in the switching element 3 can be shared without being changed. Further, by short-circuiting the gate terminal 6 and the source terminal 7, the diode 8 built in the sense switching element 2 can be used as a substitute for a high withstand voltage diode separately required outside the switching element 3 by a DESAT system in a normal case. For this reason, cost reduction or space saving can be realized.

Further, according to the embodiment described above, the semiconductor device includes the sense resistor 32 connected to the source terminal 7 of the sense switching element 2, the comparator 33 that compares voltage input to the sense resistor 32 with reference voltage and outputs a comparison result, the voltage source 35 that inputs reference voltage to the comparator 33, and the control circuit 34 connected to the comparator 33. Here, the gate terminal 6 and the gate terminal 4 are short-circuited. Then, the control circuit 34 controls voltage applied to the gate terminal 4 based on output from the comparator 33. According to such a configuration, if a protection circuit is a current sense circuit, a layout in the switching element 3 can be shared without being changed.

Further, according to the embodiment described above, a plurality of the switching elements 3 are connected in parallel. In each of the switching elements 3, the gate terminal 6 which is a gate terminal of the sense switching element 2 is arranged between the gate terminal 4 which is a gate terminal of the main switching element 1 and the source terminal 7 of the sense switching element 2. According to such a configuration, it is possible to support a system of a plurality of protection circuits without changing a layout in the switching element 3. For this reason, convenience is improved. Further, by arranging the gate terminal 6 between the gate terminal 4 and the source terminal 7, in a case where the gate terminal 6 and the gate terminal 4 are short-circuited and in a case where the gate terminal 6 and the source terminal 7 are short-circuited, it is possible to easily connect the gate terminal 6 and the gate terminal 4 or the source terminal 7 in a shortest distance.

Further, according to the embodiment described above, with one of a plurality of the switching elements 3 as a first switching element, the semiconductor device includes the resistor 22 connected to the source terminal 7 of the sense switching element 2 included in the first switching element, the capacitor 23 connected to the resistor 22, and the driver IC 42. Here, in the first switching element, the gate terminal 6 of the sense switching element 2 and the source terminal 7 of the sense switching element 2 are short-circuited. Then, in a case where voltage of the capacitor 23 exceeds a predetermined threshold, the driver IC 42 controls voltage applied to the gate terminal 4 in the switching element 3. According to such a configuration, also in a case where short circuit current flows between the drain terminal 21 and the source terminal 5 of the main switching element 1 in a plurality of the switching elements 3 among a plurality of the switching elements 3 connected in parallel, a corresponding one of the main switching elements 1 can be appropriately protected by detecting short circuit current by a DESAT circuit connected to the source terminal 7 of each of the main switching elements 1.

Furthermore, according to the embodiment described above, with one of the switching elements 3 different from the first switching element among a plurality of the switching elements 3 as a second switching element, the semiconductor device includes the sense resistor 32 connected to the source terminal 7 of the sense switching element 2 included in the second switching element, the comparator 33 that compares voltage input to the sense resistor 32 with reference voltage and outputs a comparison result, the voltage source 35 that inputs reference voltage to the comparator 33, and the driver IC 42 connected to the comparator 33. Here, in the second switching element, the gate terminal 6 of the sense switching element 2 and the gate terminal 4 of the main switching element 1 are short-circuited. Then, the driver IC 42 controls voltage applied to the gate terminal 4 in the switching element 3 based on output from the comparator 33. According to such a configuration, also in a case where short circuit current flows between the drain terminal 21 and the source terminal 5 of the main switching element 1 in a plurality of the switching elements 3 among a plurality of the switching elements 3 connected in parallel, a corresponding one of the main switching elements 1 can be appropriately protected by detecting short circuit current by a current sense circuit connected to the source terminal 7 of each of the main switching elements 1.

Further, according to the embodiment described above, with one of a plurality of the switching elements 3 as a first switching element and one of a plurality of the switching elements 3 different from the first switching element as a second switching element, the semiconductor device includes the resistor 22 connected to the source terminal 7 of the sense switching element 2 included in the first switching element, the capacitor 23 connected to the resistor 22, the sense resistor 32 connected to the source terminal 7 of the sense switching element 2 included in the second switching element, the comparator 33 that compares voltage input to the sense resistor 32 with reference voltage and outputs a comparison result, the voltage source 35 that inputs reference voltage to the comparator 33, and the driver IC 42. Here, in the first switching element, the gate terminal 6 of the sense switching element 2 and the source terminal 7 of the sense switching element 2 are short-circuited. Further, in the second switching element, the gate terminal 6 of the sense switching element 2 and the gate terminal 4 of the main switching element 1 are short-circuited. Then, in a case where voltage of the capacitor 23 exceeds a predetermined threshold, the driver IC 42 controls voltage applied to the gate terminal 4 in the switching element 3. Further, the driver IC 42 controls voltage applied to the gate terminal 4 in the switching element 3 based on output from the comparator 33. According to such a configuration, cost reduction or space saving can be realized by sharing the driver IC 42 between a case of constituting a DESAT circuit and a case of constituting a current sense circuit.

Further, according to the embodiment described above, the sense switching element 2 is constituted by a SiC-MOSFET. According to such a configuration, in the switching element 3 including the sense switching element 2 of a SiC-MOSFET, the forward voltage Vf of a built-in diode at low current is high as compared with Si (0.6 V). For this reason, in a case of comparison with a DESAT system in which a high withstand voltage diode is connected to the outside, a response speed can be increased by using a built-in diode of a SiC-MOSFET having higher forward voltage than Si.

Regarding Variation of Embodiment Described Above

In the embodiment described above, there is a case where quality, a material, a dimension, a shape, a relative arrangement relationship, an implementation condition, and the like of each constituent element are also be described, but these are one example in all aspects and are not restrictive.

Accordingly, numerous variations and equivalents, examples of which are not shown, are assumed within a scope of a technique disclosed in the present description. For example, a case where at least one constituent element is modified, added, or omitted, and a case where at least one constituent element in at least one embodiment is extracted and combined with a component in another embodiment are included.

Further, in the embodiment described above, in a case where a material name or the like is described without being particularly specified, as long as no contradiction arises, the material includes other additives, for example, an alloy or the like.

Further, as long as no contradiction arises, in a case where it is described in the above-described embodiment that “one” constituent element is included, “one or more” of the constituent elements may be included.

Further, description in the present description is referred to for all purposes related to the present technique, and none of the description is recognized as a conventional technique.

EXPLANATION OF REFERENCE SIGNS

- 1: main switching element
- 2: sense switching element
- 3: switching element
- 4: gate terminal
- 5: source terminal
- 6: gate terminal
- 7: source terminal
- 22: resistor
- 23: capacitor
- 24: control circuit
- 32: sense resistor
- 33: comparator
- 34: control circuit
- 35: voltage source
- 42: driver IC

The invention claimed is:

1. A semiconductor device comprising:

a main switching element including a MOSFET; and a sense switching element including a MOSFET, having a smaller area in plan view than the main switching element, and for detecting current flowing through the main switching element, wherein a first gate terminal that is a gate terminal of the sense switching element is arranged between a second gate terminal that is a gate terminal of the main switching element and a source terminal of the sense switching element.

2. The semiconductor device according to claim 1, further comprising:

a resistor connected to the source terminal of the sense switching element;

a capacitor connected to the resistor; and a control circuit, wherein the first gate terminal and the source terminal are short-circuited, and the control circuit controls voltage applied to the second gate terminal in a case where voltage of the capacitor exceeds a predetermined threshold.

3. The semiconductor device according to claim 1, further comprising:

a sense resistor connected to the source terminal of the sense switching element;

a comparator that compares voltage input to the sense resistor with reference voltage and outputs a comparison result;

a voltage source that inputs the reference voltage to the comparator; and a control circuit connected to the comparator, wherein the first gate terminal and the second gate terminal are short-circuited, and the control circuit controls voltage applied to the second gate terminal based on output from the comparator.

4. A semiconductor device comprising a plurality of switching elements including a main switching element including a MOSFET and a sense switching element including a MOSFET, having a smaller area in plan view than the main switching element, and for detecting current flowing through the main switching element, the switching elements being connected in parallel, wherein in each of the switching elements, a first gate terminal that is a gate terminal of the sense switching element is arranged between a second gate terminal that is a gate terminal of the main switching element and a source terminal of the sense switching element.

5. The semiconductor device according to claim 4, wherein one of a plurality of the switching elements is set as a first switching element, the semiconductor device further comprising:

a resistor connected to the source terminal of the sense switching element included in the first switching element;

a capacitor connected to the resistor; and a driver IC, wherein the first gate terminal of the sense switching element and the source terminal of the sense switching element in the first switching element are short-circuited, and the driver IC controls voltage applied to the second gate terminal in the switching element in a case where voltage of the capacitor exceeds a predetermined threshold.

6. The semiconductor device according to claim 4, wherein one of the switching elements different from the first switching element among a plurality of the switching elements is set as a second switching element, the semiconductor device further comprising:

a sense resistor connected to the source terminal of the sense switching element included in the second switching element;

a comparator that compares voltage input to the sense resistor with reference voltage and outputs a comparison result;

a voltage source that inputs the reference voltage to the comparator; and a driver IC connected to the comparator, wherein the first gate terminal of the sense switching element and the second gate terminal of the main switching element in the second switching element are short-circuited, and the driver IC controls voltage applied to the second gate terminal in the switching element based on output from the comparator.

7. The semiconductor device according to claim 4, wherein one of a plurality of the switching elements is set as a first switching element, and one of the switching elements different from the first switching element among a plurality of the switching elements is set as a second switching element, the semiconductor device further comprising:

a resistor connected to the source terminal of the sense switching element included in the first switching element;

a capacitor connected to the resistor;

a sense resistor connected to the source terminal of the sense switching element included in the second switching element;

a comparator that compares voltage input to the sense resistor with reference voltage and outputs a comparison result;

a voltage source that inputs the reference voltage to the comparator; and a driver IC, wherein the first gate terminal of the sense switching element and the source terminal of the sense switching element in the first switching element are short-circuited, the first gate terminal of the sense switching element and the second gate terminal of the main switching element in the second switching element are short-circuited, and the driver IC controls voltage applied to the second gate terminal in the switching element in a case where voltage of the capacitor exceeds a predetermined threshold, and controls voltage applied to the second gate terminal in the switching element based on output from the comparator.

8. The semiconductor device according to claim 1, wherein the sense switching element includes a SiC-MOSFET.

9. The semiconductor device according to claim 4, wherein the sense switching element includes a SiC-MOSFET.

* * * * *